(12) United States Patent
Choi et al.

(10) Patent No.: US 9,842,866 B2
(45) Date of Patent: Dec. 12, 2017

(54) METHOD OF MANUFACTURING ARRAY SUBSTRATE, DISPLAY SUBSTRATE, AND DISPLAY DEVICE

(71) Applicant: BOE TECHNOLOGY GROUP CO., LTD., Beijing (CN)

(72) Inventors: Seung Jin Choi, Beijing (CN); Hee Cheol Kim, Beijing (CN); Hyun Sic Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/122,168

(22) PCT Filed: Jul. 28, 2015

(86) PCT No.: PCT/CN2015/085294
§ 371 (c)(1),
(2) Date: Aug. 27, 2016

(87) PCT Pub. No.: WO2016/123933
PCT Pub. Date: Aug. 11, 2016

(65) Prior Publication Data
US 2016/0372499 A1    Dec. 22, 2016

(30) Foreign Application Priority Data

Feb. 5, 2015   (CN) .......................... 2015 1 0061122

(51) Int. Cl.
*H01L 21/308*   (2006.01)
*H01L 27/12*    (2006.01)
(Continued)

(52) U.S. Cl.
CPC ........ *H01L 27/1288* (2013.01); *H01L 21/308* (2013.01); *H01L 21/324* (2013.01);
(Continued)

(58) Field of Classification Search
None
See application file for complete search history.

(56) References Cited

U.S. PATENT DOCUMENTS

| 8,349,630 B1 | 1/2013 | Hsu |
| 2002/0052057 A1 | 5/2002 | Wong |

(Continued)

FOREIGN PATENT DOCUMENTS

| CN | 1849711 A | 10/2006 |
| CN | 102402081 A | 4/2012 |

(Continued)

OTHER PUBLICATIONS

International Search Report and Written Opinion from PCT Application Serial No. PCT/CN2015/085294, dated Sep. 25, 2015, 8 pages.

(Continued)

*Primary Examiner* — Asok K Sarkar
(74) *Attorney, Agent, or Firm* — Kinney & Lange, P.A.

(57) ABSTRACT

A method of manufacturing an array substrate, a display substrate and a display device are disclosed. The method of manufacturing an array substrate comprises: forming a pattern of an active layer and a pattern of source and drain electrodes on a substrate; forming a pattern of a first transparent electrode and a pattern of a passivation layer through one single patterning process; and processing the substrate on which the pattern of the passivation layer having been formed, such that a material of the passivation layer fills at least partially in a gap in the pattern of the first transparent electrode. Through forming the pattern of the first transparent electrode and the passivation layer by one single patterning process, number of masks used in the manufacturing process of the array substrate is reduced.

9 Claims, 5 Drawing Sheets

(51) Int. Cl.
 *H01L 21/77* (2017.01)
 *H01L 21/3213* (2006.01)
 *H01L 21/324* (2006.01)

(52) U.S. Cl.
 CPC ........ *H01L 21/32139* (2013.01); *H01L 21/77* (2013.01); *H01L 27/12* (2013.01)

(56) References Cited

U.S. PATENT DOCUMENTS

| | | |
|---|---|---|
| 2002/0119586 A1 | 8/2002 | Kido |
| 2002/0125477 A1 | 9/2002 | So |
| 2004/0109098 A1 | 6/2004 | Kim et al. |
| 2007/0031763 A1 | 2/2007 | Park |
| 2016/0054616 A1* | 2/2016 | Makiuchi .......... G02F 1/133345 349/138 |

FOREIGN PATENT DOCUMENTS

| | | |
|---|---|---|
| CN | 102645803 A | 8/2012 |
| CN | 102723309 A | 10/2012 |
| CN | 103116232 A | 5/2013 |
| CN | 103309081 A | 9/2013 |
| CN | 103383945 A | 11/2013 |
| CN | 103676374 A | 3/2014 |
| CN | 103681488 A | 3/2014 |

OTHER PUBLICATIONS

First Chinese Office Action, for Chinese Patent Application No. 201510061122.6, dated Jan. 25, 2017, 13 pages.
Chinese Second Office Action, for Chinese Patent Application No. 201510061122.6, dated Jun. 1, 2017, 13 pages.
Extended European Search Report dated Aug. 22, 2017, for corresponding European Application No. 15880882.4.

* cited by examiner

METHOD OF MANUFACTURING ARRAY SUBSTRATE, DISPLAY SUBSTRATE, AND DISPLAY DEVICE

TECHNICAL FIELD

The present disclosure relates to the field of display technologies, and specially, to a method of manufacturing an array substrate, a display substrate and a display device.

BACKGROUND

Recently, liquid crystal display technologies have been widely used in display of television, mobile phones and common information. A liquid crystal display panel for displaying a picture mainly includes an array substrate for driving the display panel to display a picture, a color filter substrate for realizing a color display, and liquid crystals filled between the array substrate and the color filter substrate. The array substrate has a multilayer structure. In an example of an advanced super dimension switch (HADS) liquid crystal display panel with a high opening ratio, the array substrate mainly includes a gate line, an active layer, source and drain electrodes, a pixel electrode, a passivation layer and a common electrode. When manufacturing the array substrate, the passivation layer is usually made through a resin process, which may reduce a capacitance between the source and drain electrodes and the pixel electrode, and in turn, reduce a RC delay on the source and drain electrodes, thereby reducing power consumption of the display panel. Therefore, during a specific process of manufacturing the array substrate, a plurality of patterning processes are performed on the gate line, the active layer, the source and drain electrodes, the pixel electrode, the resin layer and the common electrode successively, and thereby at least six times of mask processes should be performed to complete the manufacturing of the array substrate. Such a manufacturing process has a relative high cost and the process is complicated.

Thus, a technical problem that needs to be solved urgently by those skilled in the art is how to reduce the number of mask processes during manufacturing an array substrate, so as to simplify the manufacturing process and reduce manufacturing cost of the array substrate.

SUMMARY

A method of manufacturing an array substrate, a display substrate and a display device are provided in embodiments of the present disclosure to solve a technical problem of prior art, that is, masks are used too many times during manufacturing an array substrate such that manufacturing process of the array substrate is complicated.

In an aspect of the present disclosure, there is provided a method of manufacturing an array substrate.

In an exemplary embodiment, the method of manufacturing an array substrate may comprise steps of: forming a pattern of an active layer and a pattern of source and drain electrodes on a substrate; forming a pattern of a first transparent electrode and a pattern of a passivation layer through one single patterning process; and processing the substrate on which the pattern of the passivation layer having been formed, such that a material of the passivation layer fills at least partially in a gap in the pattern of the first transparent electrode.

According to another exemplary embodiment, the step of forming the pattern of the first transparent electrode and the pattern of the passivation layer through one single patterning process may comprise: forming a film of the transparent conductive layer and a film of the passivation layer in sequence; performing a patterning process on the film of the passivation layer to form the pattern of the passivation layer; and performing a patterning process on the film of the transparent conductive layer by using the pattern of the passivation layer as a mask, so as to form the pattern of the first transparent electrode.

According to another exemplary embodiment, the step of processing the substrate on which the pattern of the passivation layer having been formed may comprise: performing an annealing process on the substrate on which the pattern of the passivation layer having been formed.

According to another exemplary embodiment, the material of the passivation layer may comprise a resin material.

According to another exemplary embodiment, performing an annealing process on the substrate on which the pattern of the passivation layer having been formed may comprise: heating the substrate on which the pattern of the passivation layer having been formed in a circumstance where a temperature is in a range from 200° C. to 250° C.

According to another exemplary embodiment, a thickness of the pattern of the passivation layer may be in a range from 0.5 μm to 1 μm, and during the annealing process, a period of time for the heating may be about 20 minutes to 60 minutes.

According to another exemplary embodiment, the method may further comprise: forming a pattern of a second transparent electrode on the substrate after the step of processing the substrate on which the pattern of the passivation layer having been formed.

According to another exemplary embodiment, the step of forming the pattern of the active layer and the pattern of the source and drain electrodes on the substrate may comprise: forming a film of the active layer and a film of the source and drain electrodes on the substrate in sequence; and performing a patterning process on the film of the active layer and the film of the source and drain electrodes with a single mask, so as to form the pattern of the active layer and the pattern of the source and drain electrodes.

According to another exemplary embodiment, the method may further comprise a step of forming a pattern of a gate electrode on the substrate, wherein the pattern of the gate electrode is formed on the substrate before the step of forming the pattern of the active layer and the pattern of the source and drain electrodes on the substrate, or the pattern of the gate electrode is formed on the substrate on which the pattern of the active layer and the pattern of the source and drain electrodes having been formed after the step of forming the pattern of the active layer and the pattern of the source and drain electrodes on the substrate.

In another aspect of the present disclosure, there is provided a display substrate.

According to an exemplary embodiment, the display substrate may comprise an array substrate manufactured through the method according to any of the above embodiments.

In a further aspect of the present disclosure, there is provided a display device.

According to an exemplary embodiment, the display device may comprise the display substrate according to the above embodiment.

Embodiments of the present disclosure may provide the following advantageous technical effects.

Embodiments of the disclosure provide a method of manufacturing an array substrate, a display substrate and a display device. The method of manufacturing an array substrate includes: forming a pattern of an active layer and a pattern of source and drain electrodes on a substrate; forming a pattern of a first transparent electrode and a pattern of a passivation layer through one single patterning process; and processing the substrate on which the pattern of the passivation layer is formed such that a material of the passivation layer fills at least partially in a gap in the pattern of the first transparent electrode. The pattern of the first transparent electrode and the passivation layer are formed through one single patterning process such that the number of masks used in the manufacturing process of the array substrate is reduced. Compared with a process in prior art in which the pixel electrode and the passivation layer are obtained through two patterning processes respectively, the method of manufacturing the array substrate provided in the embodiment of the present disclosure may form both the pattern of the pixel electrode and the pattern of the passivation layer through just a single patterning process with only one mask, such that the number of masks used in the process of manufacturing the array substrate can be reduced, and in turn, the process of manufacturing the array substrate is simplified, thus, manufacturing cost for the array substrate can be reduced.

DETAILED DESCRIPTION OF PREFERRED EMBODIMENTS OF THE INVENTION

Embodiments of a method of manufacturing an array substrate, a display substrate and a display device will be described hereinafter in detail with reference to the attached drawings.

Figure 1:
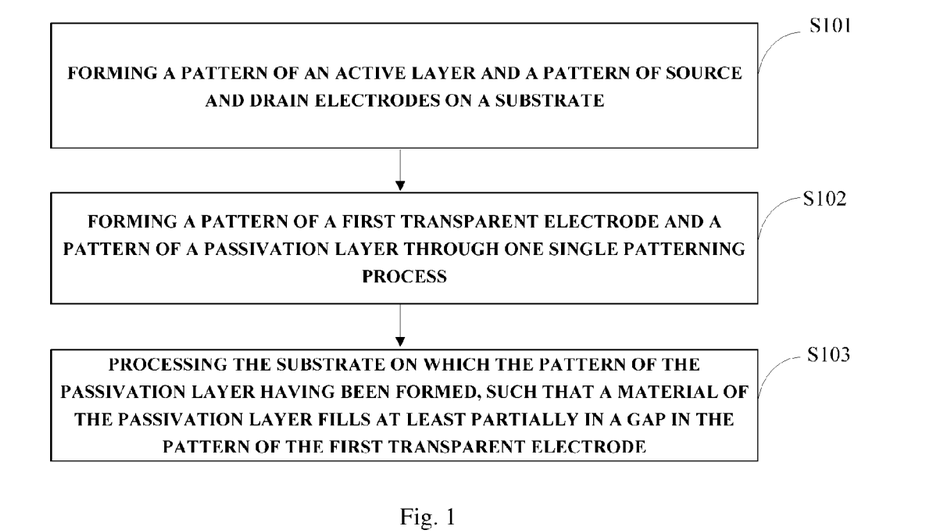
FIG. 1 is a flow chart showing a method of manufacturing an array substrate according to an embodiment of the present disclosure.

A method of manufacturing an array substrate is provided in an embodiment of the present disclosure. As shown in FIG. 1, the method may specifically comprise the following steps:

Step S101: forming a pattern of an active layer and a pattern of source and drain electrodes on a substrate;

Step S102: forming a pattern of a first transparent electrode and a pattern of a passivation layer through a single patterning process; and Step S103: processing the substrate on which the pattern of the passivation layer is formed such that material of the passivation layer at least partially fills in a gap in the pattern of the first transparent electrode.

In step S102, the first transparent electrode may be a pixel electrode, and forming the pattern of the first transparent electrode and the pattern of the passivation layer through a single patterning process may simplify the process for manufacturing the array substrate. Compared with a process in prior art in which two patterning processes are needed to form the pixel electrode and the passivation layer respectively, the method of manufacturing the array substrate provided in the embodiment of the present disclosure may form both the pattern of the pixel electrode and the pattern of the passivation layer through just a single patterning process with only one mask used, such that number of masks used in the process of manufacturing the array substrate can be reduced, and in turn, the process of manufacturing the array substrate is simplified, and thus, manufacturing cost for the array substrate can be reduced.

To be noted that, the patterning process used in the method of manufacturing the array substrate provided by the embodiment of the present disclosure may include any patterning process, such as a process in which exposure with photoresist, development and etching are involved. This process may include steps of, but not limited to: applying photoresist; exposing with a mask; developing; and etching a film that is to be applied to form a corresponding pattern. Patterning processes that will be performed many times are not limited to including identical steps. For example, a patterning process for the passivation layer may include applying photoresist, exposing, developing and etching, while a patterning process for the transparent conductive layer may only include etching.

Figure 2A:
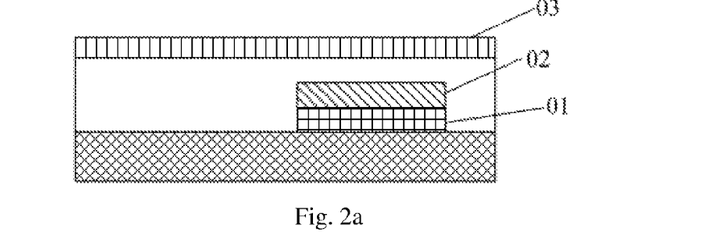
FIG. 2a is a structural schematic view of a substrate on which a transparent conductive layer is deposited according to an embodiment of the present disclosure.
Figure 2B:
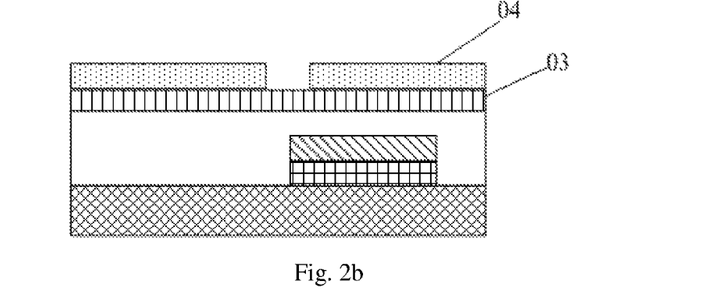
FIG. 2b is a structural schematic view of a substrate on which a pattern of a passivation layer is formed according to an embodiment of the present disclosure.
Figure 2C:
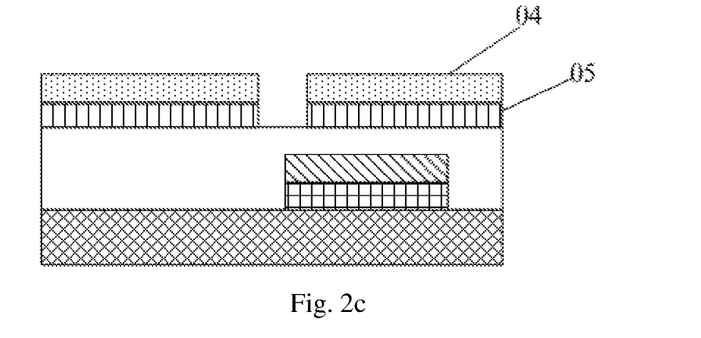
FIG. 2c is a structural schematic view of a substrate on which a pattern of first transparent electrodes is formed according to an embodiment of the present disclosure.

In practice, the above step S102 may be realized in the following manner:

forming a film of the transparent conductive layer and a film of the passivation layer in sequence, that is, the film of the transparent conductive layer 03 is firstly formed on the substrate on which the pattern of the active layer 01 and the pattern of source and drain electrode layer 02 are formed, as shown in FIG. 2a, then the film of the passivation layer is formed on the substrate on which the film of the transparent conductive layer 03 is formed;

performing a patterning process on the film of the passivation layer to form the pattern of the passivation layer, that is, performing a patterning process on the substrate on which the film of the passivation layer is formed using a mask, so as to obtain the passivation layer 04 having a pattern, as shown in FIG. 2b;

performing a patterning process on the film of the transparent conductive layer 03 through the pattern of the passivation layer that is used as a mask, so as to form the pattern of the first transparent electrode 05, in other words, performing a patterning process on the film of the transparent conductive layer 03 through the passivation layer 04 having the pattern that is used as a mask to form the pattern of the first transparent electrode 05, so as to obtain the substrate having the pattern of the first transparent electrode 05 and the pattern of the passivation layer 04, as shown in FIG. 2c. As mentioned above, the first transparent electrode 05 may be a pixel electrode.

Specifically, in the method of manufacturing the above array substrate according to the embodiment of the present disclosure, only one mask is used in the process of forming the pixel electrode and the passivation layer by performing the patterning process on the passivation layer to form the pattern of the passivation layer using the mask and performing a patterning process on the transparent conductive layer to form the pattern of the transparent conductive layer the passivation layer through using the pattern of the pattern of the passivation layer as a mask. Compared with a process in prior art in which two patterning processes are performed to form the pattern of the pixel electrode and the pattern of the passivation layer by using two masks respectively, the method of manufacturing the array substrate provided in the embodiment of the present disclosure may reduce the number of masks used in the process of manufacturing the array substrate, and in turn, simplify the process of manufacturing the array substrate, so as to reduce manufacturing cost for the array substrate.

Figure 3A:
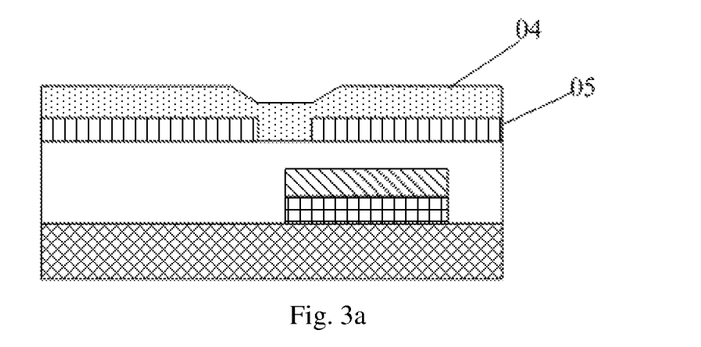
FIG. 3a is a first structural schematic view of a substrate after annealing according to an embodiment of the present disclosure.

In the method of manufacturing the above array substrate according to an exemplary embodiment of the present disclosure, for example, in order to obtain the passivation layer that is insulative, the substrate on which the pattern of the passivation layer has been formed needs to be processed, such that the material of the passivation layer at least partially fills a gap in the pattern of the first transparent electrode. According to the embodiment of the present disclosure, an annealing process is performed on the substrate on which the pattern of the passivation layer is formed such that after the annealing process, the material of the passivation layer on the substrate at least partially fills the gap in the pattern of the first transparent electrode, as shown in FIG. 3. According to an exemplary embodiment of the present disclosure, the gap in the pattern of the first transparent electrode may be completely filled with the material of the passivation layer, such that the passivation layer is formed as an integrated layer, which may achieve insulation function. In practice, there are many methods for forming an integrated passivation layer, which will not be described and limited herein.

Figure 3B:
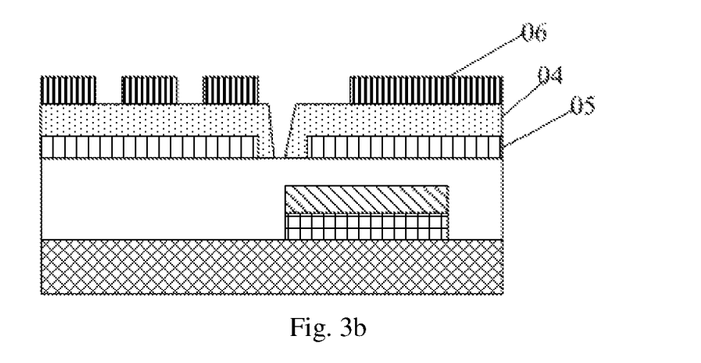
FIG. 3b is a second structural schematic view of a substrate after annealing according to an embodiment of the present disclosure.

According to another exemplary embodiment, the substrate on which the pattern of the passivation layer has been formed may be processed such that the material of the passivation layer partially fills the gap in the pattern of the first transparent electrode, as shown in FIG. 3b. In this embodiment, the material of the passivation layer 04 does not completely fill the gap in the pattern of the first transparent electrode 05, but leave a space forming a via-hole, and in this instance, the second transparent electrode 06 formed in a subsequent process may be functioned as the pixel electrode. The pixel electrode 06 may be connected with a drain electrode through the via-hole that is not completely filled with the material of the passivation layer 04, and the first transparent electrode 05 may be functioned as a common electrode for providing a voltage signal to the pixel electrode, so as to drive the pixel electrode to realize a picture displaying function. Such an embodiment will be described in detailed hereinafter.

In an exemplary embodiment, the material of the passivation layer may be a resin material, or one or more of insulative materials such as silicon nitride, silicon dioxide, which is not specifically limited herein. When a resin material is used for the passivation layer, it can not only realize an insulation function, but also decrease a capacitance between the source and drain electrodes and the pixel electrode, so as to reduce a RC delay of the source and drain electrodes, and in turn, reduce power consumption of the array substrate. In practice, however, the material of the passivation layer may be any material having an insulating characteristic, which is not limited herein.

According to an exemplary embodiment, the above mentioned annealing process on the substrate on which the pattern of the passivation layer is formed may specifically include: performing a heating process on the substrate on which the pattern of the passivation layer is formed in a circumstance where a temperature is in a range from 200° C. to 250° C. Upon heating, the material of the passivation layer melts and flows to fill the gap in the pattern of the passivation layer on the substrate where no material of the first transparent electrode exists.

According to an exemplary embodiment, after the annealing process performed on the substrate on which the pattern of the passivation layer is formed, a thickness of the passivation layer is reduced to 80%. As the annealing process is constrained by a starting voltage, the thickness of the passivation layer shall not be too large, and usually, a thickness less than 1 µm would be suitable. In the method of manufacturing the array substrate provided in the embodiment of the present disclosure, the thickness of the passivation layer is in a range from 0.5 µm to 1 µm, and during the annealing process, a period of time for the heating process is about 20 minutes to 60 minutes. In such a manner, through the annealing process performed on the pattern of the passivation layer, the material of the passivation layer may at least partially fill the gap in the pattern of the first transparent electrode.

Figure 4:
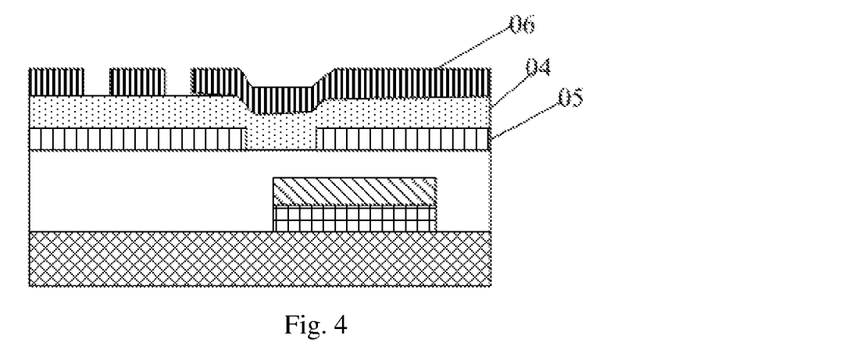
FIG. 4 is a structural schematic view of a substrate on which a pattern of second transparent electrodes is formed according to an embodiment of the present disclosure.

In the method of manufacturing the array substrate according to an exemplary embodiment of the present disclosure, after the substrate, on which the pattern of the passivation layer 04 has been formed, has been processed, the method may further include forming a pattern of the second transparent electrode 06, as shown in FIG. 4. That is, a film of the transparent conductive layer is deposited on the substrate after the substrate has been annealed, and then a patterning process is performed on the film of the transparent conductive layer to form the second transparent electrode 06. According to an example, the second transparent electrode 06 formed thereby may be a common electrode. A detailed description of the process of forming the common electrode is omitted herein, as it is similar to that in prior arts. After the passivation layer has been formed on the substrate, the common electrode is formed on the passivation layer. When the array substrate is implemented in an actual product, the common electrode may transmit voltage signal(s) to the pixel electrode, driving the pixel electrode to realize a picture display function.

According to an exemplary embodiment, the step of forming a pattern of the active layer and a pattern of the source and drain electrodes may include:

forming a film of the active layer and a film of the source and drain electrodes on the substrate in sequence; and performing a patterning process on the film of the active layer and the film of the source and drain electrodes with a mask, so as to form the pattern of the active layer and the pattern of the source and drain electrodes. In such a manner, the pattern of the active layer and the pattern of the source and drain electrodes may be formed through a single patterning process using a single mask, such that manufacturing process of the array substrate can be simplified, and in turn, manufacturing cost for the array substrate can be reduced.

The method of manufacturing the array substrate according to the embodiment of the present disclosure may further include a step of forming a gate electrode.

More specifically, the pattern of the gate electrode is formed firstly on the substrate, then the pattern of the active layer and the pattern of the source and drain electrodes are formed on the substrate on which the pattern of the gate electrode is formed. That is, before step S101, the pattern of the gate electrode is formed firstly on the substrate. In such a manner, a bottom gate type array substrate can be formed.

Alternatively, the pattern of the gate electrode may be formed on the substrate on which the pattern of the active layer and the pattern of the source and drain electrodes are formed after step S101, such that a top gate type array substrate can be obtained.

Thus, the method of manufacturing the array substrate provided by the present disclosure is adapted to manufacture not only a top gate type array substrate, but also a bottom gate type array substrate. Therefore, a corresponding manufacturing process may be provided according to practical requirements, and thus the method according to the embodiments can be widely implemented.

Figure 5A:
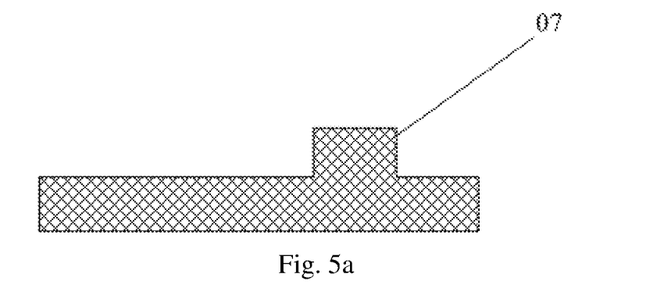
FIG. 5a is a structural schematic view of a substrate on which a gate electrode is formed according to an embodiment of the present disclosure.
Figure 5B:
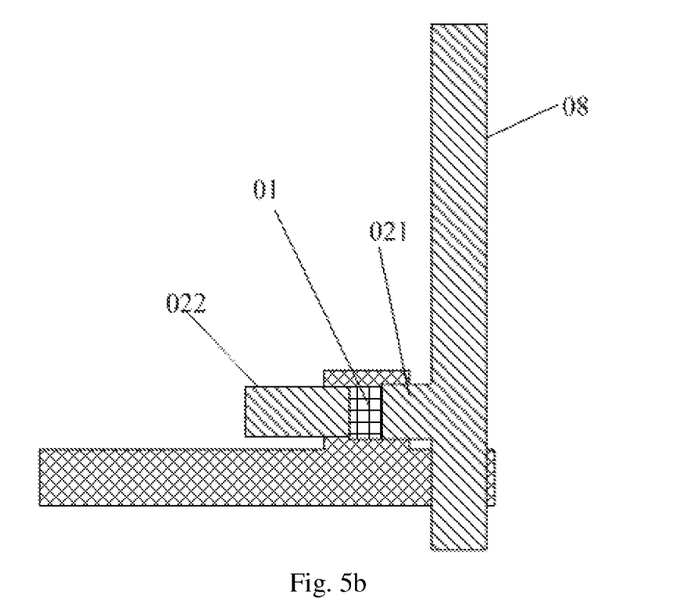
FIG. 5b is a structural schematic view of a substrate on which a source electrode and a drain electrode are formed according to an embodiment of the present disclosure.
Figure 5C:
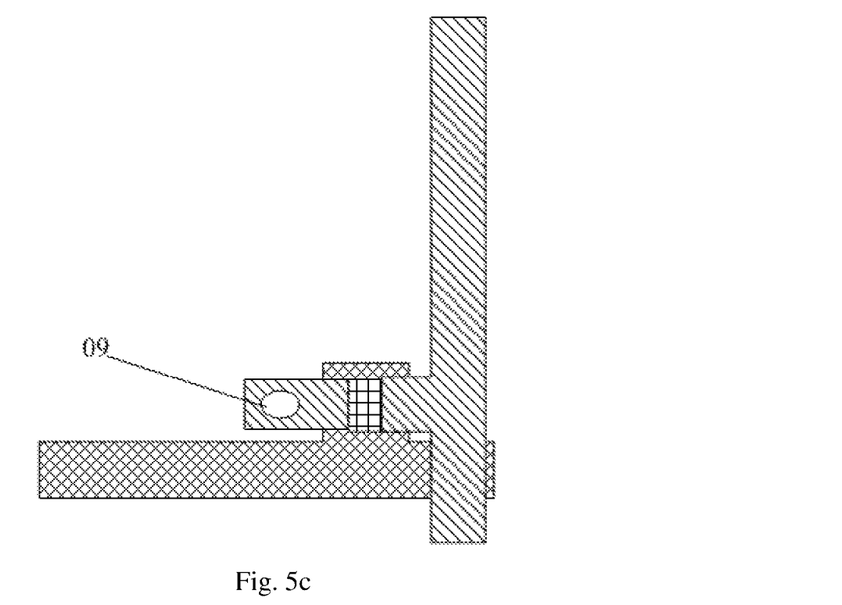
FIG. 5c is a structural schematic view of a substrate on which a via-hole is formed according to an embodiment of the present disclosure.
Figure 5D:
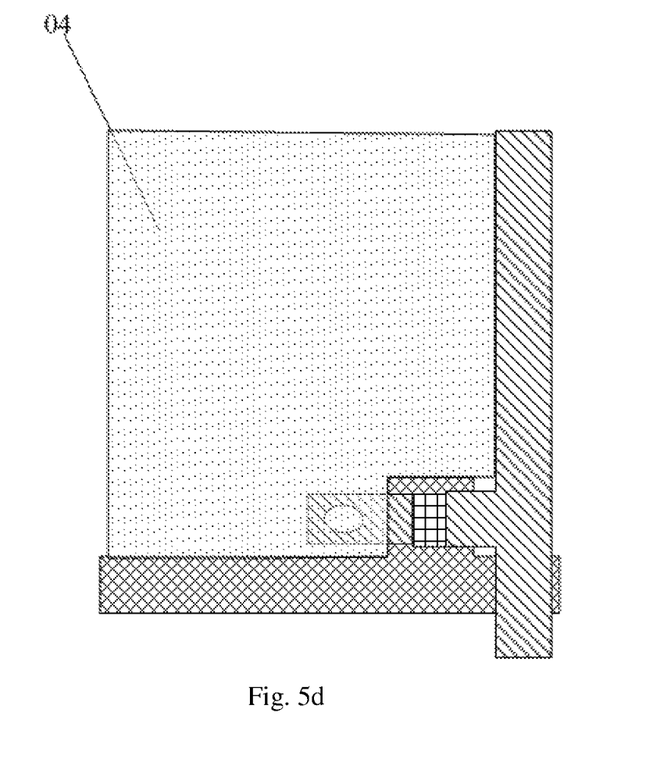
FIG. 5d is a structural schematic view of a substrate on which a passivation layer is formed according to an embodiment of the present disclosure.
Figure 5E:
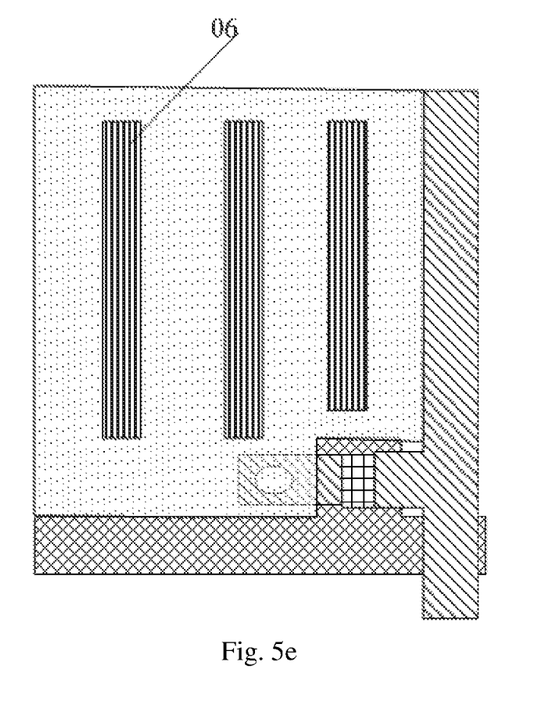
FIG. 5e is a structural schematic view of a substrate on which second transparent electrodes are formed according to an embodiment of the present disclosure.

In an exemplary embodiment, the method of manufacturing the array substrate provided by the present disclosure may include:

1. forming the gate electrode 07 on the substrate through a patterning process, wherein the pattern of the gate electrode 07 formed is shown in FIG. 5a, in which the gate electrode 07 is connected with the gate line;

2. forming a pattern of the active layer 01, a source electrode 021 and a drain electrode 022 on the substrate on which the pattern of the gate electrode 07 is formed through one single patterning process, wherein a data line 08 electrically connected with the source electrode 021 is formed while forming the source electrode 021;

3. performing a via-hole formation process on the drain electrode 022 on the substrate on which the source electrode 021 and the drain electrode 022 are formed to form a via-hole 09 in the drain electrode 022 such that the drain electrode 22 is electrically connected with the first transparent electrode 05, as shown in FIG. 5c;

4. forming the pattern of the passivation layer 04 and the first transparent electrode 05 on the substrate through one single patterning process on the substrate on which the via-hole 09 is formed, wherein the process of forming the pattern of the passivation layer 04 and the first transparent electrode 05 may be performed with reference to the specific process of step S102 according to the embodiment of the present disclosure, which will not be repeated in detail herein;

5. performing the annealing process on the substrate formed with the passivation layer 04 and the first transparent electrode 05 such that the material of the passivation layer at least partially fills the gap in the pattern of the first transparent electrode 05, as shown in FIG. 5d;

6. forming the second transparent electrode 06 on the substrate through a patterning process on the substrate that has been annealed, as shown in FIG. 5e.

Specifically, as described above, in the method of manufacturing the array substrate according to an embodiment of the present disclosure, the pattern of the passivation layer 04 formed is used as a mask in the patterning process to form the first transparent electrode 05, such that the number of masks used in the process of manufacturing the array substrate can be reduced, and in turn, manufacturing process of the array substrate is simplified, thus, manufacturing cost of the array substrate can be reduced.

Based on the same inventive concept, an embodiment of the present disclosure provides a display substrate, which includes an array substrate manufactured through the above described method of manufacturing the array substrate according to the embodiments of the present invention. The concept or principle of the display substrate in terms of solving its technical problem is similar to the array substrate and thus will not be repeated herein.

Based on the same inventive concept, an embodiment of the present disclosure provides a display device, which may be used in a mobile phone, a tablet computer, a TV set, a notebook computer, a digital frame, a navigator or any product or component that has a display function. The principle of the display device in terms of solving its technical problem is similar to the array substrate and thus will not be repeated herein.

Embodiments of the disclosure provide a method of manufacturing an array substrate, a display substrate and a display device. The method of manufacturing an array substrate includes: forming a pattern of an active layer and a pattern of source and drain electrodes on a substrate; forming a pattern of a first transparent electrode and a pattern of a passivation layer through one single patterning process; and processing the substrate on which the pattern of the passivation layer is formed such that a material of the passivation layer fills at least partially in a gap in the pattern of the first transparent electrode. The pattern of the first transparent electrode and the passivation layer are formed through one single patterning process such that the number of masks used in the manufacturing process of the array substrate is reduced. Compared with a process in prior art in which the pixel electrode and the passivation layer are obtained through two patterning processes respectively, the method of manufacturing the array substrate provided in the embodiment of the present disclosure may form both the pattern of the pixel electrode and the pattern of the passivation layer through just a single patterning process with only one mask, such that the number of masks used in the process of manufacturing the array substrate can be reduced, and in turn, the process of manufacturing the array substrate is simplified, thus, manufacturing cost for the array substrate can be reduced.

Obvious, various changes and modifications may be made by those skilled in the art in these embodiments without departing from the principles and spirit of the disclosure, those changes and modifications shall fall within the scope of the disclosure if they fall within the scope defined in the claims and their equivalents.

What is claimed is:

1. A method of manufacturing an array substrate, comprising steps of:
   forming a pattern of an active layer and a pattern of source and drain electrodes on a substrate;
   forming a pattern of a first transparent electrode and a pattern of a passivation layer through one single patterning process; and
   processing the substrate on which the pattern of the passivation layer has been formed, such that a material of the passivation layer fills at least partially in a gap in the pattern of the first transparent electrode.

2. The method according to claim 1, wherein the step of forming the pattern of the first transparent electrode and the pattern of the passivation layer through one single patterning process comprises:
   forming a film of a transparent conductive layer and a film of the passivation layer in sequence;
   performing a patterning process on the film of the passivation layer to form the pattern of the passivation layer; and
   performing a patterning process on the film of the transparent conductive layer by using the pattern of the passivation layer as a mask, so as to form the pattern of the first transparent electrode.

3. The method according to claim 1, wherein the step of processing the substrate on which the pattern of the passivation layer having been formed comprises:
   performing an annealing process on the substrate on which the pattern of the passivation layer has been formed.

4. The method according to claim 3, wherein the material of the passivation layer comprises a resin material.

5. The method according to claim 4, wherein performing an annealing process on the substrate on which the pattern of the passivation layer has been formed comprises:
   heating the substrate on which the pattern of the passivation layer has been formed in a temperature range from 200° C. to 250° C.

6. The method according to claim 5, wherein a thickness of the pattern of the passivation layer is in a range from 0.5 µm to 1 µm, and during the annealing process, a period of time for the heating is about 20 minutes to 60 minutes.

7. The method according to claim 1, further comprising:
   forming a pattern of a second transparent electrode on the substrate after the step of processing the substrate on which the pattern of the passivation layer has been formed.

8. The method according to claim 1, wherein the step of forming the pattern of the active layer and the pattern of the source and drain electrodes on the substrate comprises:
   forming a film of the active layer and a film of the source and drain electrodes on the substrate in sequence; and
   performing a patterning process on the film of the active layer and the film of the source and drain electrodes with a single mask, so as to form the pattern of the active layer and the pattern of the source and drain electrodes.

9. The method according to claim 8, further comprising a step of forming a pattern of a gate electrode on the substrate, wherein
   the pattern of the gate electrode is formed on the substrate before the step of forming the pattern of the active layer and the pattern of the source and drain electrodes on the substrate, or
   the pattern of the gate electrode is formed on the substrate on which the pattern of the active layer and the pattern of the source and drain electrodes has been formed after the step of forming the pattern of the active layer and the pattern of the source and drain electrodes on the substrate.

* * * * *